(12) United States Patent
Keane et al.

(10) Patent No.: US 10,037,589 B2
(45) Date of Patent: *Jul. 31, 2018

(54) PARALLEL IMAGE PROCESSING SYSTEM

(71) Applicant: Applied Materials, Inc., Santa Clara, CA (US)

(72) Inventors: Barry Keane, Menlo Park, CA (US); Thomas Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 273 days.

This patent is subject to a terminal disclaimer.

(21) Appl. No.: 14/203,174

(22) Filed: Mar. 10, 2014

(65) Prior Publication Data
US 2014/0192065 A1 Jul. 10, 2014

Related U.S. Application Data

(63) Continuation of application No. 13/109,563, filed on May 17, 2011, now Pat. No. 8,669,989.

(60) Provisional application No. 61/346,436, filed on May 19, 2010.

(51) Int. Cl.
  *G06T 1/20* (2006.01)
  *G06T 11/40* (2006.01)
  *G03F 7/20* (2006.01)

(52) U.S. Cl.
  CPC ............ *G06T 1/20* (2013.01); *G03F 7/70425* (2013.01); *G06T 11/40* (2013.01)

(58) Field of Classification Search
  CPC ....................................................... G06T 1/20
  See application file for complete search history.

(56) References Cited

U.S. PATENT DOCUMENTS

| | | |
|---|---|---|
| 5,798,770 A | 8/1998 | Baldwin |
| 6,459,733 B1 | 10/2002 | Yokoyama et al. |
| 6,518,973 B1 | 2/2003 | Blythe |
| 7,310,594 B1 | 12/2007 | Ganesan et al. |
| 7,733,354 B1* | 6/2010 | Mech .................... G06T 15/503 345/428 |
| 8,069,423 B2* | 11/2011 | Ghan .................. G03F 7/70466 716/55 |

(Continued)

OTHER PUBLICATIONS

PCT/US2011/037026, International Search Report, dated Sep. 27, 2011, 2 pages.

*Primary Examiner* — Kumar Patel
*Assistant Examiner* — Richard M Russell
(74) *Attorney, Agent, or Firm* — Patterson + Sheridan LLP

(57) ABSTRACT

System and method for a parallel image processing mechanism for applying mask data patterns to substrate in a lithography manufacturing process are disclosed. In one embodiment, the parallel image processing system includes a graphics engine configured to partition an object into a plurality of trapezoids and form an edge list for representing each of the plurality of trapezoids, and a distributor configured to receive the edge list from the graphics engine and distribute the edge list to a plurality of scan line image processing units. The system further includes a sentinel configured to synchronize operations of the plurality of scan line image processing units, and a plurality of buffers configured to store image data from corresponding scan line image processing units and outputs the stored image data using the sentinel.

18 Claims, 8 Drawing Sheets

(56) References Cited

U.S. PATENT DOCUMENTS

| | | | |
|---|---|---|---|
| 2004/0160627 A1 | 8/2004 | Gupta et al. | |
| 2005/0281444 A1 | 12/2005 | Lundberg et al. | |
| 2008/0260283 A1* | 10/2008 | Ivansen | B82Y 10/00 382/266 |
| 2008/0270753 A1 | 10/2008 | Achiwa et al. | |
| 2010/0149195 A1* | 6/2010 | Fernando | G06F 9/505 345/505 |

* cited by examiner

Flow of Trapezoids through the Image Processing Units

| Time-> | T0 | T1 | T2 | T3 | T4 | T5 | T6 | T7 | T8 | T9 | T10 | T11 | T12 | T13 | T14 | T15 |
|---|---|---|---|---|---|---|---|---|---|---|---|---|---|---|---|---|
| Col. X | A | B | C | S | A. | B. | C. | S | D | E | S | F. | G. | S | | |
| Col. Y | | A | B | C | S | D | E | S | D. | E. | S | E. | S | H | I. | S |
| Col. Z | | | A | AB | BC | CS | SD | DE | E | S | F | G | S | H. | I. | S |

Column of Trapezoids being Rasterized in each Column Processing Unit

| Time-> | T0 | T1 | T2 | T3 | T4 | T5 | T6 | T7 | T8 | T9 | T10 | T11 | T12 | T13 | T14 | T15 |
|---|---|---|---|---|---|---|---|---|---|---|---|---|---|---|---|---|
| Col. X | 0 | 0 | 0. | 3 | 3 | 3 | 3. | 6 | 6 | 6 | 6. | 9 | 9. | | | |
| Col. Y | 1 | 1 | 1. | 1. | 4 | 4 | 4 | 4. | 7 | 7. | 7 | 7. | 10 | 10. | | |
| Col. Z | 2 | 2 | 2 | 2 | 2 | 2 | 5 | 5 | 5. | 5 | 8 | 8 | 8. | 11 | 11 | 11. |

PARALLEL IMAGE PROCESSING SYSTEM

CROSS REFERENCE TO RELATED APPLICATIONS

This application is a continuation application of U.S. non-provisional application Ser. No. 13/109,563, "A Parallel Imaging Processing System" filed May 17, 2011, which claims the benefit of U.S. provisional application No. 61/346,436, "A Parallel Imaging Processing System" filed May 19, 2010. The aforementioned United States applications are hereby incorporated by reference in their entirety.

FIELD OF THE INVENTION

The present invention relates to the field of computer imaging processing. In particular, the present invention relates to system that employs a parallel image processing mechanism for applying mask data patterns to substrate in a lithography manufacturing process.

BACKGROUND OF THE INVENTION

Fast-paced technology progress in semiconductor integrated circuit (IC) industry has benefited well for the manufacturing of active matrix liquid crystal display (AMLCD) TV and computer monitor displays. In the recent years, the size of LCD TV and computer monitor displays has grown to be larger and yet more affordable.

In the semiconductor IC industry, a technology generation is defined by the critical dimension (CD) of the circuit design rules. As each technology generation progresses, the IC of the later generation has smaller feature CD target and tighter tolerance. For the Flat Panel Display (FPD) industry, on the other hand, a technology generation is classified by the physical dimension of substrate used in manufacturing. In one example, the substrate sizes (in millimeter×millimeter) of FPDs sixth generation (G6) in 2005, eighth generation (G8) in 2007, and tenth generation (G10) in 2009 are 1500×1800, 2160×2460, and 2880×3080 respectively.

The lithography challenges in terms of making semiconductor ICs and FPD substrates are both trying to make larger sizes more affordable. However, they are entirely different from the manufacturing perspective. For the IC industry, a primary challenge is small CD features can be produced on a round 300 mm wafer. The goal is to pack as many transistors as possible for achieving better functionalities in the same die size. But for the FPD industry, one primary challenge is how large an entire rectangle substrate can be processed. The larger FPD substrate can be processed in a manufacturing line, the bigger size TVs or monitors can be produced with lower cost. The typical LCD TVs and monitors are designed with more sophisticated thin film transistor (TFT) for better performance. Still, the TFT CD target remains in the same specification range. In one viewpoint, one of the main challenges for FPD manufacturing is to keep throughput in pace with justifiable economics for each successive generation. Achieving profitable process yield is a key consideration, and the manufacturing process window needs to be preserved.

Conventionally, lithography technologies for manufacturing of FPD are derived from lithography process technologies for making semiconductor ICs. Majority of lithography exposure tools used for making FPD substrates are projection stepper and/or scanner systems. These are either 2-times reduction or 1-to-1 projection from mask to substrate. In order to project mask patterns to the substrate, the mask must first be made with the acceptable CD specifications. The FPD mask manufacturing process is similar to the one used for manufacturing semiconductor ICs, with the exception that the mask size for making semiconductor ICs is about 150 mm or 6 inches per side, whereas the mask size for manufacturing FPD, in one example, may be nearly 8-times larger per side, or physically more than one meter per side.

The challenges discussed previously for the manufacturing of future generations of FPDs are driven by the need for cost reduction for the FPD industry. One key motivation is to achieve cost efficiency when the newer manufacturing generation is being adopted. Lithography process requires maintaining throughput efficiency while assuring product yield better than previous generations. This demands wider lithography process window and fewer process defects while contending with bigger FPD substrates. As discussed above, there are numerous shortcomings with the existing exposure tool configurations. One of the major shortcomings is associated with the use of a mask. The size of the mask is too large to be manufactured cost effectively. This shortcoming continues to grow as the size of the mask must increase in order to keep up with future generations of FPDs. Therefore, there is a need for an improved imaging writer system that addresses the issues of the conventional tools and approaches.

Numerous advances have been made in preparing images for computer display and print devices. The graphics pipeline typically handles transform coordinates, clipping, scan conversion, and other functions. By contrast, parallel scanning for mask-less lithography demands different challenges. For example, in parallel scanning of mask-less lithography, the application requires more tightly coupled parallelization between the image processing engines and image exposure devices. Therefore, there is a need for a system that separates the preprocessing from the image exposure and controls the rasterizing pipeline to maintain high throughput, address issues related to stitching between adjacent imaging regions, and at the same time uses low-cost commodity components.

SUMMARY

System and method for a parallel image processing mechanism for applying mask data patterns to substrate in a lithography manufacturing process are disclosed. In one embodiment, the parallel image processing system includes a graphics engine configured to process one or more graphical objects to generate a plurality of convex polygons, and to form an edge list for representing each of the plurality of convex polygons, a distributor configured to distribute the edge list to a plurality of scan line image processing units, a plurality of scan line image processing units configured to receive the edge list and to process the plurality of convex polygons in parallel, control logic configured to synchronize operations of the plurality of scan line image processing units using a sentinel, wherein the sentinel includes a unique pattern configured to signal end of a scan line, and a plurality of buffers configured to store image data generated from the scan line image processing units.

The graphic engine includes control logic configured to identify transitions at the boundaries of the one or more graphical objects according to a scan direction, and control logic configured to partition the one or more graphical objects into the plurality of convex polygons. Each scan line image processing unit includes a FIFO configured to store items of the edge list, an incremental interpolation update logic configured to update items of the edge list, a multiplexor configured to receive data from a distributor and a previous scan line image processing unit.

The distributor includes control logic configured to balance load of processing the edge list among the plurality of scan line image processing units in accordance with a predetermined interleave factor, and control logic configured to balance load of processing the edge list among the plurality of scan line image processing units in accordance with FIFO size of each scan line image processing unit.

The plurality of scan line image processing units includes control logic configured to process a portion of a convex polygon in a round-robin fashion. And each scan line image processing unit includes control logic configured to scan the portion of the convex polygon according to a predetermined scan direction, control logic configured to rasterize the portion of the convex polygon, and control logic configured to perform fade operations at boundaries of the portion of the convex polygon. The control logic configured to scan the portion of the convex polygon includes control logic configured to scan the portion of the convex polygon along a column or control logic configured to scan the portion of the convex polygon along a row.

The control logic configured to perform fade operations includes control logic configured to use a second sentinel to control fade operations at boundaries of the portion of the convex polygon; and control logic configured to output data from the fade operations at each of the scan line image processing unit in accordance with the second sentinel.

The control logic configured to synchronize operations of the plurality of scan line image processing units includes control logic configured to link the FIFO in each scan line image processing unit to form a chain of FIFOs for storing the plurality of convex polygons described in the edge list, and control logic configured to control output of image data from the plurality of buffers using the sentinel.

In another embodiment, a method of performing parallel image processing includes processing one or more graphical objects to generate a plurality of convex polygons, forming an edge list for representing each of the plurality of convex polygons, distributing the edge list to a plurality of scan line image processing units, processing the plurality of convex polygons described in the edge list in parallel using the plurality of scan line image processing units, synchronizing operations of the plurality of scan line image processing units using a sentinel, wherein the sentinel includes a unique pattern configured to signal end of a scan line, and storing image data generated from the scan line image processing units using a plurality of buffers.

The method of processing one or more graphical objects includes identifying transitions at the boundaries of the one or more graphical objects according to a scan direction, and partitioning the one or more graphical objects into the plurality of convex polygons. Each scan line image processing unit includes a FIFO configured to store items of the edge list, an incremental interpolation update logic configured to update items of the edge list, a multiplexor configured to receive data from a distributor and a previous scan line image processing unit.

The method of distributing the edge list includes balancing load of processing the edge list among the plurality of scan line image processing units in accordance with a predetermined interleave factor, and balancing load of processing the edge list among the plurality of scan line image processing units in accordance with FIFO size of each scan line image processing unit.

The method of processing the plurality of convex polygons includes configuring each of scan line image processing unit to process a portion of a convex polygon in a round-robin fashion. And the processing the plurality of convex polygons further includes scanning the portion of the convex polygon according to a predetermined scan direction, rasterizing the portion of the convex polygon, and performing fade operations at boundaries of the portion of the convex polygon. The method of scanning the portion of the convex polygon includes scanning the portion of the convex polygon along a column or scanning the portion of the convex polygon along a row.

The method of performing fade operations includes using a second sentinel to control fade operations at boundaries of the portion of the convex polygon; and outputting data from the fade operations at each of the scan line image processing unit in accordance with the second sentinel.

The method of synchronizing operations of the plurality of scan line image processing units includes linking the FIFO in each scan line image processing unit to form a chain of FIFOs for storing the plurality of convex polygons described in the edge list, and controlling output of image data from the plurality of buffers using the sentinel.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

Like numbers are used throughout the specification.

DESCRIPTION OF EMBODIMENTS

System and method are provided for a parallel image processing mechanism for applying mask data patterns to substrate in a lithography manufacturing process. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 1:
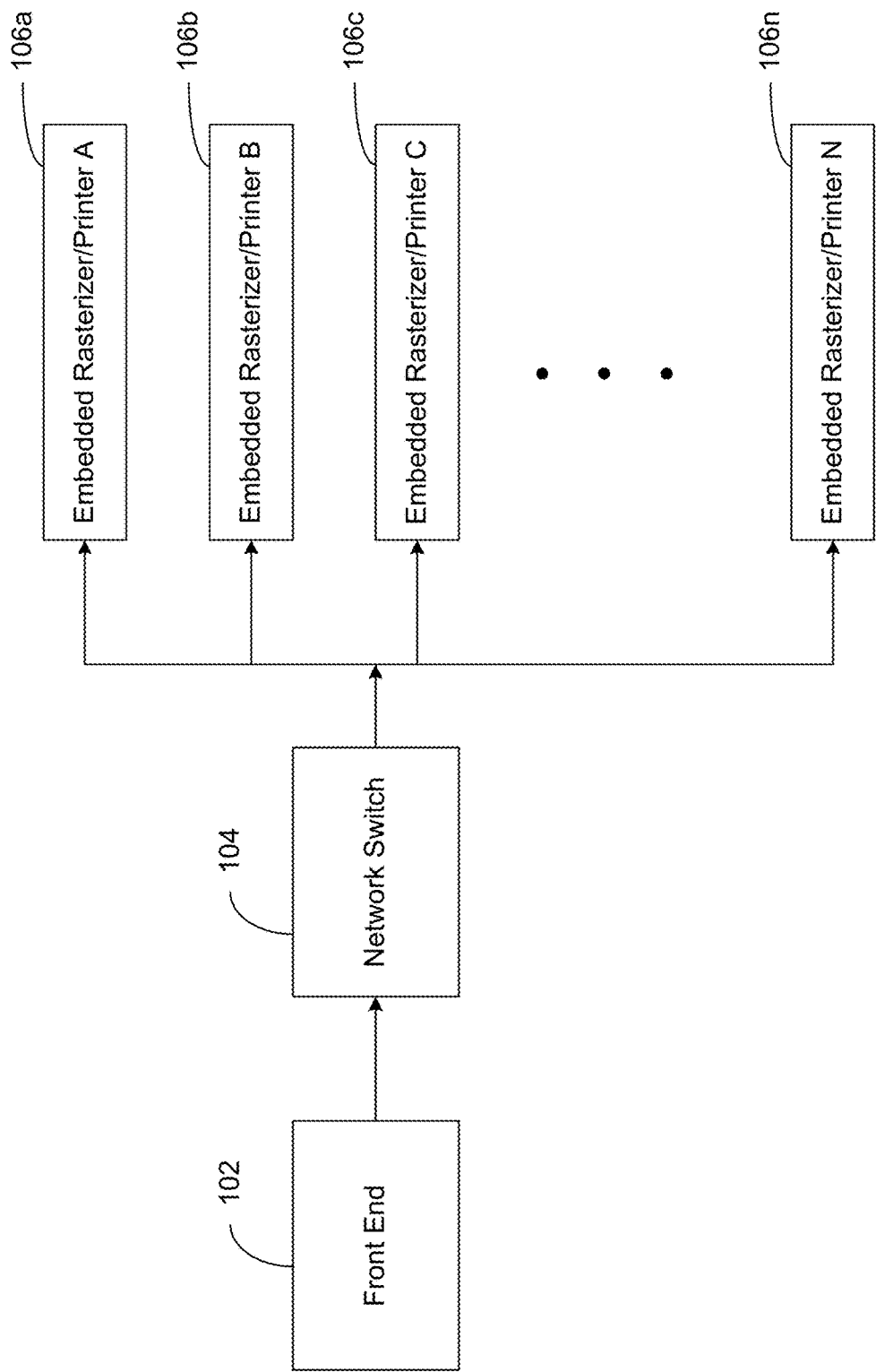
FIG. 1 illustrates a parallel image processing system according to embodiments of the present disclosure.

FIG. 1 illustrates a parallel image processing system according to embodiments of the present disclosure. In one approach, the parallel image processing system may prepare model geometry in a frontend 102, and then it distributes the data through a network switch 104 to partitions across a generic network. Multiple embedded rasterizers 106a-106n (also referred to as printers) can be employed to perform embedded scan conversion, which function in parallel to reduce cabling, computing, and image buffering.

Figure 2:
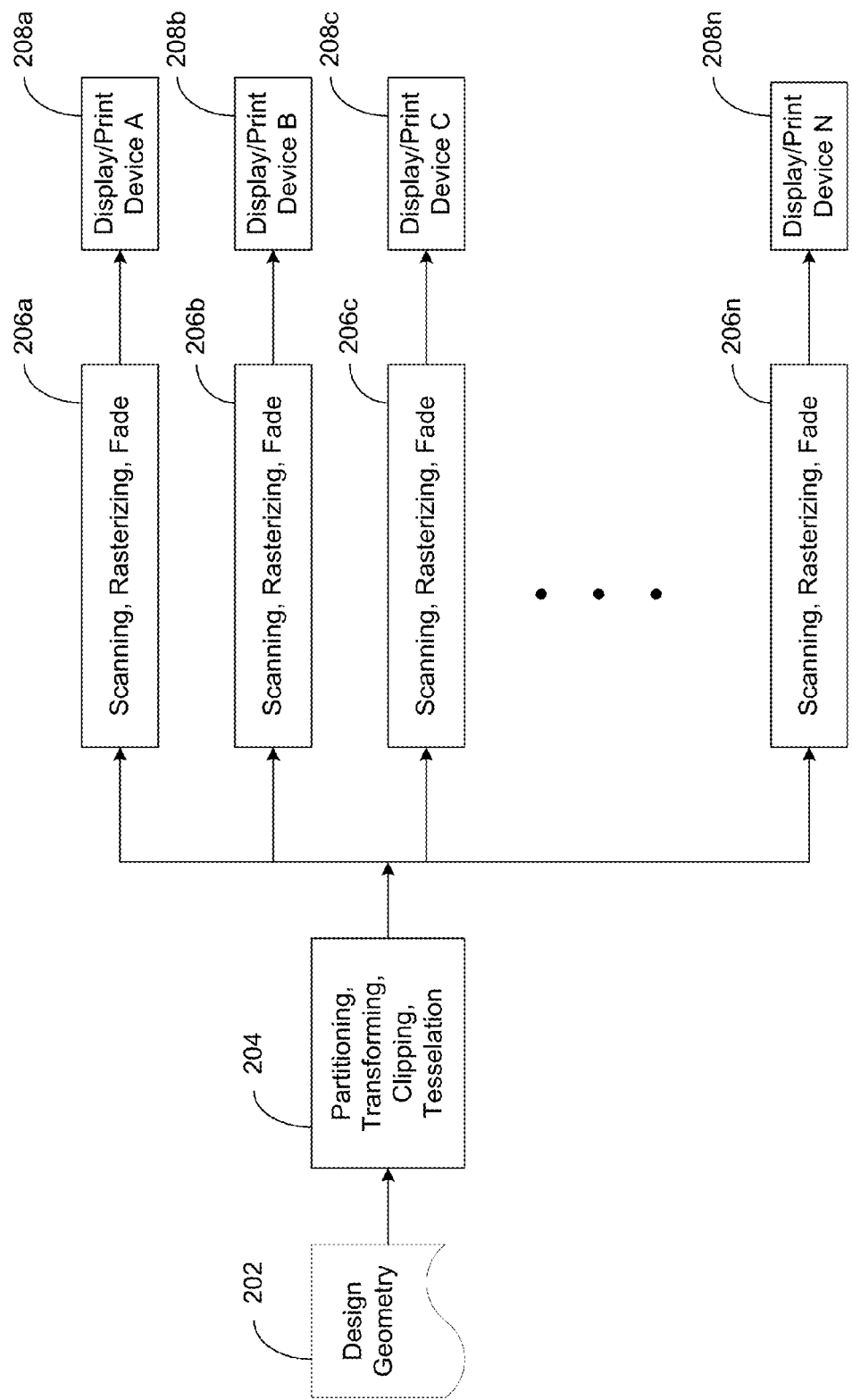
FIG. 2 illustrates another parallel image processing system according to embodiments of the present disclosure.

FIG. 2 illustrates a method implemented by the parallel image processing system according to embodiments of the present disclosure. In the example shown in FIG. 2, the parallel image processing system can be configured to receive design geometry 202 as an input. The method then performs partitioning, transforming, clipping and tessellation 204 of the design geometry 202 to identify a plurality of scan lines. The method performs scanning, rasterizing, and fades operations 206a-206n to process the plurality of scan lines with corresponding plurality of scan line image processing units. The output imaging data is then delivered over dedicated graphics connection, such as Peripheral Component Interconnect Express (PCIe), Digital Visual Interface (DVI), and DisplayPort, to corresponding display/print devices 208a-208n. In one approach, the system may be implemented in field-programmable circuitry which can support parallel resources but may have limited on-chip memory.

Figure 3B:
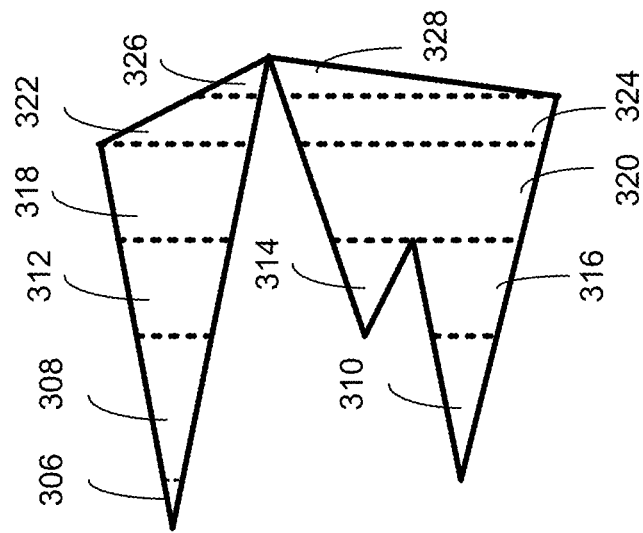
FIGS. 3a-3b illustrate methods for partitioning an object for parallel image processing according to embodiments of the present disclosure.
Figure 3A:
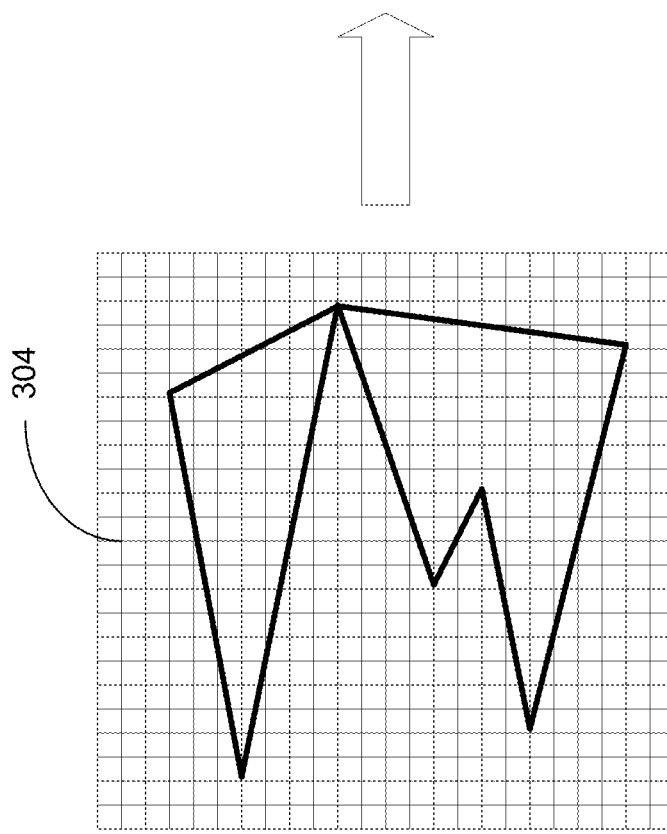

FIG. 3 illustrates methods for partitioning an object for parallel image processing according to embodiments of the present disclosure. To facilitate parallel image processing acceleration, polygons are first tessellated into convex polygons, such as trapezoids and triangles, along the scan direction (collectively referred to as trapezoids for short in the following description). Input trapezoids are sorted by scan line. Note that within a scan line, the order of trapezoids may be arbitrary. A raster unit fills polygons one scan line at a time. All trapezoids intersecting the current scan line are queued in a FIFO. A raster unit retrieves (or de-queues) each trapezoid from the FIFO and turns on (fills) the pixels lying between the trapezoid sections/legs.

Note that transforming and clipping operations are performed once to preprocess the design geometry, followed by one or more exposure jobs using tens or hundreds of digital micro-mirror devices (DMDs) each exposing tens of millions of bitmap images derived by scanning the preprocessed geometry. Parallel image processing of the partitioned trapezoids are described below in association with FIG. 6 to FIG. 8.

Figure 4:
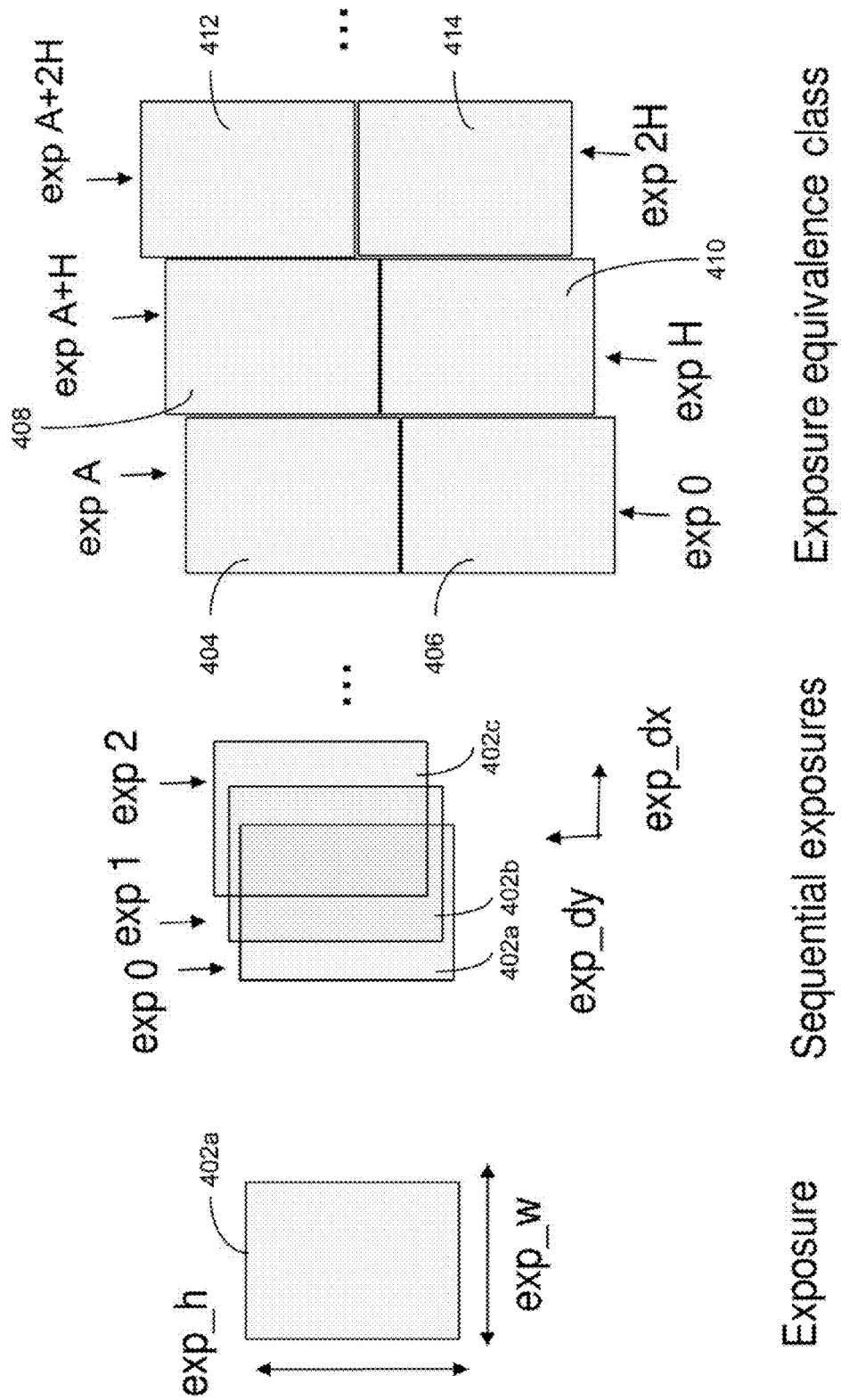
FIG. 4 illustrates methods for scanning images in a multiple exposure system according to embodiments of the present disclosure.

FIG. 4 illustrates methods for scanning images in a multiple exposure system according to embodiments of the present disclosure. In the example shown in FIG. 4, objects to be imaged (not shown) are referenced by a pixel grid 402a. In other embodiments, one or more objects may be referenced by the pixel grid 402a and be processed simultaneously. It is assumed that multiple objects may occupy any area within the pixel grid 402a. In one implementation, the pixel grid 402a may have a width of 768 pixels and length of 1024 pixels. In other implementations, pixel grids of different sizes may be employed.

After the first exposure, the pixel grid 402a is shifted horizontally by an amount of exp_dx and vertically by an amount exp_dy. In one implementation, the amount of exp_dx may be 8.03 pixels and the amount of exp_dy may be 0.02 pixels. Note that the offsets exp_dx and exp_dy are not integer multiple of pixels. The intent is to achieve consistency in imaging all figure edges. If the offsets were chosen to be integer multiple of pixels, the pixel grids would be aligned from one to the other. In that case, if an edge falls on the pixel grid, a sharper edge may be imaged; but if an edge falls in-between the pixel grid, a blurrier edge may be imaged. With offsets being non-integer multiple of pixels, the edges are imaged in similar manner when about a few hundred exposures are overlaid and accumulated, with different pixel grid positions, having the edges fall on pixel boundaries occasionally and fall in other locations of a pixel at other times. This method of jittered pixel averaging (JPA) provides sub-pixel edge position resolution, with consistent imaging performance for all edges.

In the mid section of FIG. 4, the pixel grid 402a has shifted by exp_dx and exp_dy and is shown as 402b after the first shift, and 402c after the second shift. Note that this drawing is not to scale and the amount of exp_dx and exp_dy have been exaggerated for illustration purposes. The right side of FIG. 4 illustrates successive exposures of one equivalence class. Specifically, an exposure class comprises a set of abutting images. For example, a class is exposed successively and shown as exp A, exp A+H, and exp A+2H, which are represented by the numerals 404, 408, and 412 respectively in one row, and exp 0, exp H, and exp 2H, which are represented by the numerals 406, 410, and 414 respectively, in another row. The entire set of overlapping exposures can be divided into M equivalence classes.

Figure 5:
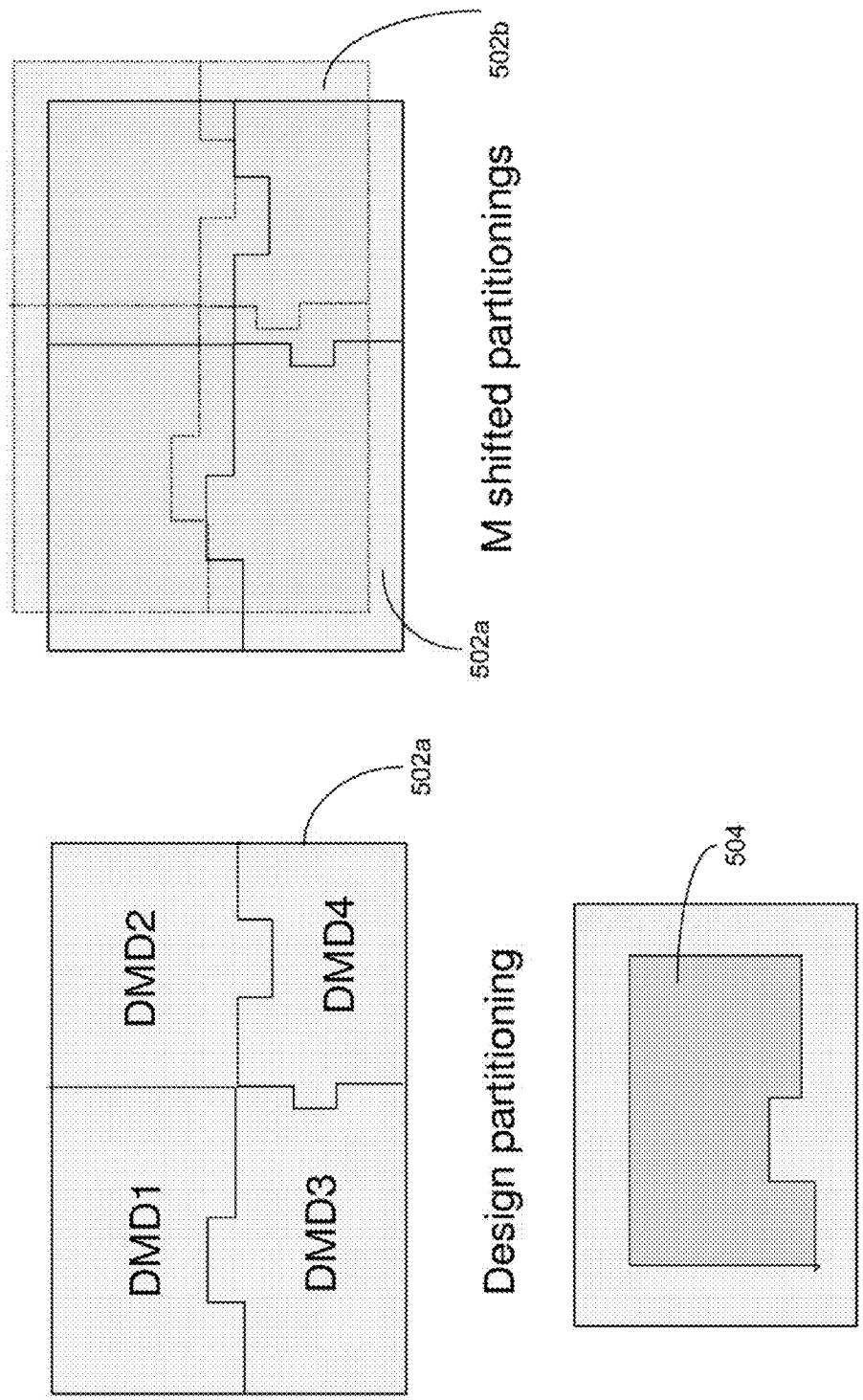
FIG. 5 illustrates methods for performing fade operations between boundaries of multiple image partitions according to embodiments of the present disclosure.

FIG. 5 illustrates methods for performing fade operations between boundaries of multiple image partitions according to embodiments of the present disclosure. The image partition boundaries may be shifted as a group, for example to position 502b, in implementing a fade operation. Fading is done by clipping all exposures within one of the M equivalence classes by the fade mask defined by the corresponding shifted partitioning.

There are numerous challenges need to be addressed. For example, if the FIFO size of a scan line is large enough to hold the worst-case number of trapezoids per column, this would lead to a waste of memory in many typical cases, and parallel processing of multiple scan lines (e.g. N scan lines) would further waste memory by a factor of N. If the interleave factor is greater than 1, it would require duplicating trapezoids. This may further burden the system, which may be already memory-throughput-limited. In addition, inputting next column's trapezoids may be serialized with processing current column's trapezoids, and synchronizing between the scan line image processing units adds overhead to the system. Moreover, the system needs to address the issue of fade when stitching two of more adjacent imaging areas.

Figure 6:
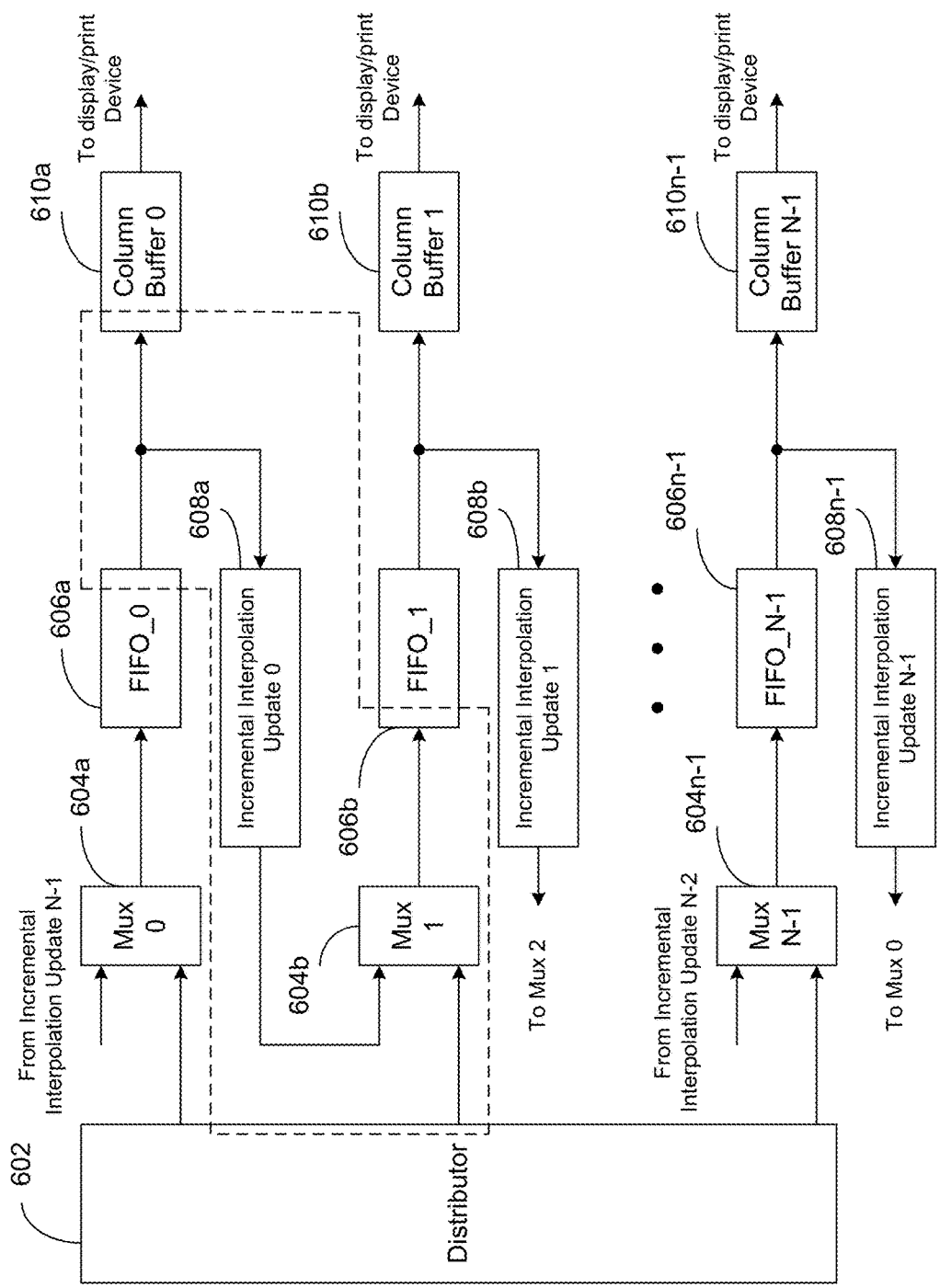
FIG. 6 illustrates a block diagram of a portion of the parallel image processing system according to embodiments of the present disclosure.

FIG. 6 illustrates a block diagram of a portion of the parallel image processing system according to embodiments of the present disclosure. In this exemplary embodiment shown in FIG. 6, the system includes a distributor 602 and a plurality of scan line image processing units that are configured to operate in parallel to implement a polygon-fill method with a factor of N. Each scan line image processing unit includes a multiplexor 604a-601n-1, a FIFO 606a-606n-1, an incremental interpolation update logic 608a-608n-1, and a scan line buffer 610a-610n-1 (also referred to as column buffer in this example).

In one implementation, each scan line image processing unit can be implemented with various digital logic resources, such as adders, multiplexors, comparators, and FIFOs. These digital logic resources may be implemented in a field programmable gate array (FPGA). Other methods of implementing these digital logic resources may be used by persons skilled in the art, such as application specific integrated circuits (ASICs). The application can configure N parallel scan line image processing units to satisfy desired throughput in many typical cases while achieving maximum elasticity in the worst case.

Note that the system can work with N relatively small scan-line FIFOs. Memory requirements are modest and scale linearly with W, not N*W, where W=worst-case polygons/line. The system produces in-order results that avoid the need for output scheduling and buffering. Also, the system utilizes the property of scan line coherence, which exhibits the tendency for pixels in adjacent lines to have same value. Furthermore, the system may be extended to implement edge fading, which is desirable in parallel imaging applications.

In one implementation, the system uses an interleave factor of 1, and it circulate trapezoids between the scan line image processing units to achieve the following design objectives.

Minimize duplication of resources

More likely to be load-balanced (because of scan coherence).

Worst-case number of trapezoids per column<=N*FIFOsize.

Overlapped input: input a new trapezoid whenever previous unit finishes processing a trapezoid.

Polygons that require imaging adjustment/processing such as fade are fed into same raster processing units.

In one approach, the system uses a sentinel to synchronize among scan line image processing units. A sentinel contains a special value whose presence guarantees termination of a loop that processes structured (especially sequential) data. The sentinel makes it possible to detect the end of the data when no other means to do so is provided. The sentinel can be selected in such a way that it is guaranteed to be distinct from all legal data values, since otherwise the presence of such values may be taken to signal the end of the data prematurely. For example, a negative integer can be used as a sentinel to indicate the end of a sequence of non-negative integers.

The sentinel may be configured to signal a scan line processing unit to output the current column in the following manner. Sentinel is en-queued in FIFO at end of a column's working set. Subsequent entries belong to the next working set (current column+N). A scan line image processing unit can input a sentinel after it has input all trapezoids for that column from both the distributor 602 and the previous scan line image processing unit. A column buffer of a scan line image processing unit can output its data after receiving that column's sentinel; and it can receive a sentinel after the column buffer of the previous scan line image processing unit has output its data.

According to embodiments of the present disclosure, a polygon-fill method and system that with parallelization solutions are described. In one approach, the input polygons are partitioned as needed to be convex along the scan dimension as shown in FIG. 3b, having a straight line between any 2 points in the polygon having the same x-value lies entirely within the polygon. The resulting polygons are sorted by starting x-value. The fill routine works on the set of polygon edges that intersect the current column, keeping the edges sorted by y-value, and filling between each pair of edges in the working set. The y-value of each active edge is interpolated using an iterative algorithm. In one approach, a midpoint algorithm may be used to perform the incremental interpolation update. In another approach, a Bresenham line drawing algorithm may be used to perform the incremental interpolation update. As the fill procedure advances the current scan line across the raster, edges are entered into and removed from the working set as they move into and leave a working window, respectively.

In addition, the implementation further includes dividing the input polygons into trapezoids with bases along the scan direction (as shown in the example of FIG. 3b, vertical trapezoids when performing vertical scanning). In this way, edges enter and leave the working set in pairs, removing the need to sort the edges within the working set. This can simplify the system allowing for a FIFO data structure to manage the working set. As each column is processed, active pairs are filled, updated, and re-queued in the FIFO until they go out of view and are then discarded.

According to embodiments of the present disclosure, the parallel system can be created using multiple column fill units. In one approach, the interleave factor may be set to 1; that is, unit 0 works on columns 0, N, 2N; unit 1 works on columns 1, N+1, 2N+1, and so on. This interleaving factor may be chosen to improve load balancing between column units and to simplify the iterative interpolation of y-values in the example of vertical scans.

Note that the above descriptions use an example of vertical scan, and as a result, image objects are partitioned for processing in columns. According to other embodiments of the present disclosure, the same principle can be applied to implement systems using horizontal scans, and image objects may be partitioned for processing in rows.

The image processing of multiple scan lines can be distributed as follows. Each scan line image processing unit works on a separate column partition, maintains its own working set FIFO, and stores results in an individual column output buffer. The distributor advances round-robin enqueuing pairs into the N FIFOs. An edge pair is distributed to the working set FIFO handling the pair's starting column.

Synchronization can be achieved using a sentinel that circulates through the set of FIFOs. When finished assigning edge pairs to the first column unit, the distributor appends the sentinel; before circulating pairs to the first column unit, the last unit waits until the sentinel has been entered into the first unit's FIFO. The system has been primed when the sentinel is entered. When re-circulating edge pairs, a scan line image processing unit passes the pair into the FIFO of the next scan line image processing unit. An optional fade may be applied using the same method except filling with 0.

In other embodiments, this method may be extended to scan a series of bitmaps. Polygons are in turn mapped (quantized) to each bitmap.

Figure 7:
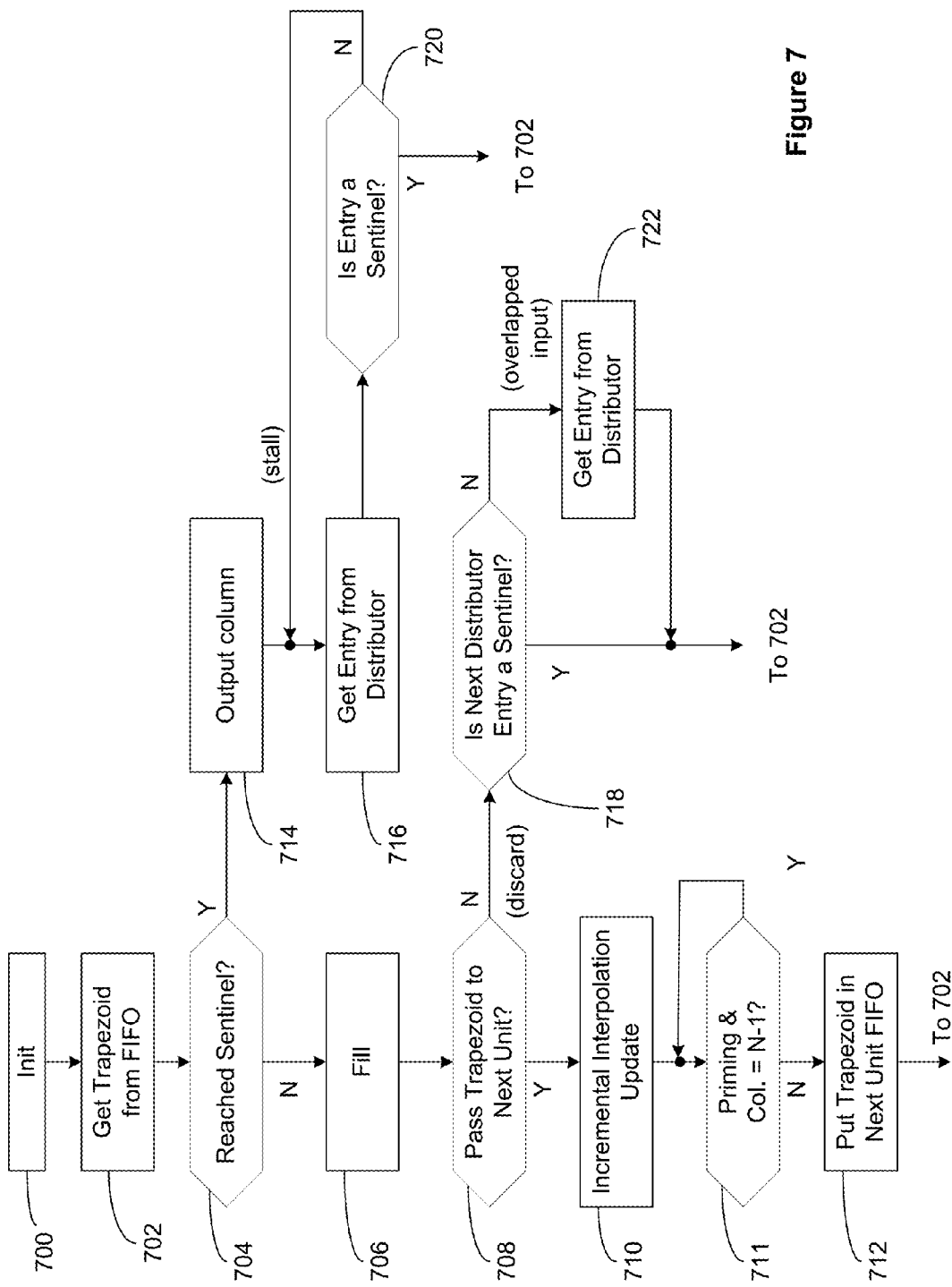
FIG. 7 illustrates a flow chart of a portion of the control logic of the parallel image processing system according to embodiments of the present disclosure.

FIG. 7 illustrates a flow chart of a portion of the control logic of the parallel image processing system according to embodiments of the present disclosure. In particular, the flow chart depicts the blocks and their corresponding control logic enclosed by the dotted lines of FIG. 6. As shown in the example of FIG. 6, a distributor derives edge pairs from vertical trapezoids and assigns each pair to a scan line image processing unit (also referred to as column unit or column processing unit for short in this example) for handling the column where that pair starts. Each column unit can be internally pipelined to perform one fill operation per cycle. When not full, each FIFO can input one pair per cycle. Each FIFO input multiplexor selects a propagated pair from a previous scan line processing unit if one is available, else inputs the next assigned distributor pair.

Referring to FIG. 7, the method of controlling the portion of the parallel image processing system enclosed in dotted-lines of FIG. 6 is described. The method starts in block 700 where it performs initialization of the control logic and moves to block 702 thereafter. In block 702, the method gets trapezoids for processing from FIFO. In block 704, a determination is made as to whether sentinel has been reached. If sentinel has been reached (704_Yes), the method moves to block 714. Alternatively, if sentinel has not been reached (704_No), the method moves to block 706, where the scan line image processing unit performs the fill operation to image the trapezoid.

In block 708, a determination is made as to whether to pass the trapezoid to the next scan line image processing unit based on whether the end of the trapezoid has been reached. If it is determined not to pass the trapezoid to the next scan line image processing unit (708_No), the method moves to block 718. Alternatively, if it is determined to pass the trapezoid to the next scan line image processing unit (708_Yes), the method moves to block 710. In block 710, the method performs incremental interpolation update of the trapezoid before moving to block 711.

In block 711, a determination is made as to whether the condition of priming and column equals N−1 (last column) is met. If the condition is met (711_Yes), the method loops back and stays in block 711 until the condition has been changed. In the alternative (711_No), the method moves to block 712, where the method puts the trapezoid in the FIFO of the next scan line image processing unit for subsequent processing. After that, the method moves to block 702 to work on the next trapezoid.

In block 714, after reached sentinel, the method outputs image data in the column. In block 716, the method gets an entry from the distributor, and moves to block 720. In block 720, a determination is made as to whether the entry is a sentinel. If the entry is not a sentinel (720_No), the method returns to block 716, and the method is stalled. In the alternative, if the entry is a sentinel (720_Yes), the method moves to block 702 to get a new trapezoid from FIFO for processing.

In block 718, a determination is made as to whether the next distributor entry is a sentinel. If the next distributor entry is a sentinel (718_Yes), the method moves to block 702. Alternatively, if the next distributor entry is not a sentinel (718_No), indicating situation of an overlapped input, the method moves to block 722. In block 722, the method gets an entry from the distributor, and then moves to block 702.

The method and operations of the distributor and the scan line image processing unit (also known as column unit for short in this example) are further described in the exemplary codes listed below.

Let N be the number of column units.
Let a tile be the set of trapezoids spanning columns [0,N−1].
Let T=ceil(num_columns/N)=tiles per bitmap.

```
procedure distribute(N):
    foreach tile t in [0,T-1]:
        if (t != 0) wait for sentinel to circulate to unit 0
        load tile into the N column units
        optionally load fade tile into the N column units
        if (t==0) append sentinel (dummy edge pair) into unit 0
procedure column_unit(n):
    column = n
    next_column_center_x = (column + 1) * column_width + column_width/2
    foreach edge pair in working set:
        if (sentinel):
            next_column_center_x += N*column_width
            output column buffer
            zero column buffer
        else:
            fill edge pair with ones (or zeros for fade pairs)
            if (pair.endx < next_column_center_x):
                do_propagate = 0
            else:
                do_propagate = 1
                iteratively-interpolate y-value of both edges
            if (do_propagate):
                if (n==N-1) wait until sentinel first entered into unit 0 FIFO
    propagate-circulate pair to column unit (n+1)%N
```

For example, let the input be a line-space pattern of a given length, i.e. all lines start in column 0 and extend through the entire bitmap. Let L=the number of lines. Let L be the worst-case=N*FIFOsize−2. L clocks after first pair enters column unit 0, L edge pairs are enqueued.

Note that the processing pipeline has completed the startup phase, where every unit performs one fill operation per cycle. The column units are synchronized in a manner that columns are output in order on separate clocks. In this example, the worst-case number of trapezoids is limited by N*FIFOsize−1, not by individual FIFO size. Columns are output on average once every T=max((L+1)/N, 1) clock cycles. N can be configured such that, in the common case, T=1. In particular, if the common case input has number of trapezoids per column<=L and the target column period T is C, then make N>=((L+1)/C).

Figures 8A, 8B, 8C:
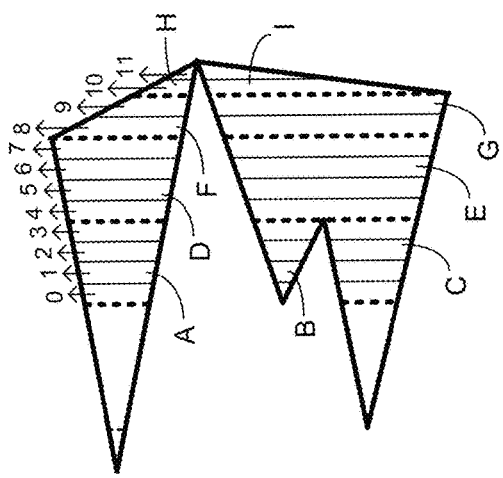
FIGS. 8a-8c illustrate exemplary operations of scan line image processing units according to embodiments of the present disclosure.

FIGS. 8a-8c illustrate exemplary operations of scan line image processing units according to embodiments of the present disclosure. For simplicity of illustration, this example assumes the imaging processing units process a portion of the object. As shown in FIG. 8a, the geometrical object of FIG. 3 is partitioned into a number of trapezoids, namely A, B, C, D, E, F, G, H, and I. Note that for purpose of simplicity, triangular shapes, such as B, H, and I, are also referred to as trapezoids. The part of the object to the left of the trapezoids A and C is ignored in this example. These nine trapezoids are arranged in sequence first from top to bottom, and then from left to right as follows.

A D F H
B
C E G I

Within each trapezoid, the imaging area is further partitioned into pixel columns for processing in parallel. For example, the imaging areas of trapezoids A, B and C are in columns 0 to 3, the imaging areas of trapezoids D and E are in columns 4 to 7, the imaging areas of trapezoids F and G are in columns 8 and 9, and the imaging areas of trapezoids H and I are in columns 10 and 11.

FIG. 8b illustrates a flow of the trapezoids through the scan line image processing units according to embodiments of the present disclosure. In this example, the system includes three scan line image processing units, also referred to as column processing units for short, namely Col. X, Col. Y, and Col. Z, and each column processing unit has a queue size of two. In other words, each processing unit can hold maximum of two trapezoids at one time in this example. T0 through T15 represent the sequence of time steps in processing the trapezoids A through I.

As shown in FIG. 8b, the three rows illustrate the flow of trapezoids through the system. The letter S represents a sentinel configured to control the synchronization of the image processing units. A sentinel enters the system and is treated the same way as a trapezoid. A cell is underlined (such as "A" at T0) to represent the time when it enters the image processing system. For example, trapezoid A enters the image processing system at time step T0; trapezoid B enters the image processing system at time step T1; trapezoid C enters the image processing system at time step T2; sentinel S enters the image processing system at time step T4; trapezoid D enters the image processing system at time step T5; trapezoid E enters the image processing system at time step T6; trapezoid F enters the image processing system at time step T10; trapezoid G enters the image processing system at time step T11; trapezoid H enters the image processing system at time step T12; and trapezoid I enters the image processing system at time step T13.

In addition, a cell with a period (such as "A." at T4) represent the time when a trapezoid exits the system. For example, trapezoid A exits the system at time step T4; trapezoid B exits the system at time step T5; trapezoid C exits the system at time step T6; trapezoid D exits the system at time step T9; trapezoid E exits the system at time step T10; trapezoid F exits the system at time step T11; trapezoid G exits the system at time step T12; trapezoid H exits the system at time step T13; trapezoid I exits the system at time step T15; and sentinel S exits the system at time step T15. This example illustrates that the trapezoids are efficiently processed in parallel within the system and are sent out in an orderly manner. A box encloses a cell if the column unit stalls at that time (see Col. Z at time step T3).

FIG. 8c illustrates each column of trapezoids being rasterized in each column processing unit according to embodiments of the present disclosure. As shown in this example, a cell with a period (for example "0." with column processing unit Y at time T3) indicates the time when that image column is ready for displaying/printing. Note that this coincides with the processing of the sentinel by that column processing unit (shown in FIG. 8b). In this approach, data is distributed such that each column processing unit is exclusively assigned to work on one column from each tile. For example, columns 0, 1, and 2 are being rasterized by Col. X, Col. Y, and Col. Z respectively at time step T0; columns 0, 1, and 2 are being rasterized by Col. X, Col. Y, and Col. Z respectively at time step T1; columns 0, 1, and 2 are being rasterized by Col. X, Col. Y, and Col. Z respectively at time step T2; columns 0, 1, and 2 are being rasterized by Col. X, Col. Y, and Col. Z respectively at time step T3; columns 3, 1, and 2 are being rasterized by Col. X, Col. Y, and Col. Z respectively at time step T4; columns 3, 4, and 2 are being rasterized by Col. X, Col. Y, and Col. Z respectively at time step T5; columns 3, 4, and 2 are being rasterized by Col. X, Col. Y, and Col. Z respectively at time step T6; columns 3, 4, and 5 are being rasterized by Col. X, Col. Y, and Col. Z respectively at time step T7; columns 6, 4, and 5 are being rasterized by Col. X, Col. Y, and Col. Z respectively at time step T8; columns 6, 7, and 5 are being rasterized by Col. X, Col. Y, and Col. Z respectively at time step T9; columns 6, 7, and 8 are being rasterized by Col. X, Col. Y, and Col. Z respectively at time step T10; columns 9, 7, and 8 are being rasterized by Col. X, Col. Y, and Col. Z respectively at time step T11; columns 9, 10, and 8 are being rasterized by Col. X, Col. Y, and Col. Z respectively at time step T12; columns 9, 10, and 11 are being rasterized by Col. X, Col. Y, and Col. Z respectively at time step T13; columns 10, and 11 are being rasterized by Col. Y, and Col. Z respectively at time step T14; and columns 11 is being rasterized by Col. Z at time step T15. Note that this example prints 12 (0 through 11) columns in 16 time steps.

Note that in FIG. 8c, the sentinel provides separation between one tile's trapezoids from the next tile's trapezoids. In this way, the sentinel coordinates data input and output (I/O) of the overall system. First, it synchronizes input of new trapezoids from the distributor with the flow of existing trapezoids by inputting/inserting trapezoids into the proper tiles. In addition, the sentinel synchronizes the output of each column processing unit by ensuring each column is printed in the right order.

According to embodiments of the present disclosure, the above methodology can be extended to handle fade operations of trapezoids as in applications previously described in association with FIG. 4 and FIG. 5. In one approach, two sentinels are controlled to flow through the column processing units. A first sentinel S1 is used to control and indicate the end of processing of a tile's normal trapezoids. A second sentinel S2 is used to control and indicate the end of a tile's fade trapezoids. Each column processing unit is controlled to switch between two states, namely processing of normal trapezoids and processing of fade trapezoids, in processing the two sentinels, and outputs the final column after receiving the S2 sentinel. Note that the examples shown in FIGS. 8a-8c are simplified for illustration purposes. In a typical application, 64 column processing units and each with a queue size of 128 trapezoids may be employed.

Note that the approach described in examples FIG. 8a-8c uses distributed memory rather than shared memory. Although shared memory methods (multiple computational units sharing the same memory) may be simpler to formulate, they have problems with scaling, both in terms of performance and system cost. There are a number of benefits of using distributed memory methods as described in association with FIGS. 8a-8c. First, the distributed memory methods do not have the coherence/contention/race condition problems of the shared memory methods. Second, it allows the system to be implemented to distribute data to independent processing units having their corresponding own private memory. This can be done at different levels. For example, it can be done at the job level as described in association with FIGS. 1 and 2, where the job can be distributed across multiple imaging processing units. Also, it can be done at the rasterizing level as described in association with FIGS. 6, 7 and 8, where a trapezoid can be distributed across multiple scan line image processing units (a.k.a. column processing units) for processing.

Embodiments of the present disclosure not only are applicable and beneficial to the lithography for manufacturing of FPD and mask for FPD manufacturing, the making of one-of-the-kind or precision duplicates of life-sized art on glass substrate, they are also applicable and beneficial to the manufacturing of integrated circuits, computer generated holograms (CGH), printed circuit board (PCB), for large imaging display applications in both micro and meso scales.

Embodiments of the present disclosure are further applicable and beneficial to lithography manufacturing processes without using mask, such as writing intended mask data patterns to substrates directly. In this way, the mask cost and associated issues of concern are eliminated. Embodiments of the present disclosure enable exposure tools for mask-less exposure that exceeds the throughput requirements for the upcoming G10 and beyond. More importantly, this configuration comes with improved process window to ensure better lithography yield.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A method of performing mask-less lithography using parallel image processing, comprising:
   processing one or more graphical objects to generate a plurality of convex polygons, wherein the processing one or more graphic objects utilizes a pixel grid shifted horizontally and vertically by a non-integer amount;
   forming an edge list for representing each of the plurality of convex polygons;
   distributing the edge list to a plurality of scan line image processing units;
   processing the plurality of convex polygons described in the edge list in parallel using the plurality of scan line image processing units;
   synchronizing operations of the plurality of scan line image processing units using a sentinel, wherein the sentinel includes a unique pattern configured to signal end of a scan line;
   storing image data generated from the scan line image processing units using a plurality of buffers;
   outputting the image data from the plurality of buffers to a plurality of digital micro-mirror devices, wherein outputting the image data is controlled using the sentinel; and
   applying a mask data pattern directly to a substrate using the plurality of digital micro-mirror devices by selectively exposing the substrate to radiation using the stored image data in a mask-less lithography process.

2. The method of claim 1, wherein processing one or more graphical objects comprises:
   identifying transitions at the boundaries of the one or more graphical objects according to a scan direction; and
   partitioning the one or more graphical objects into the plurality of convex polygons.

3. The method of claim 1, wherein
   each scan line image processing unit includes: a FIFO configured to store items of the edge list, an incremental interpolation update logic configured to update items of the edge list, a multiplexor configured to receive data from a distributor and a previous scan line image processing unit.

4. The method of claim 1, wherein distributing the edge list comprises:
   balancing load of processing the edge list among the plurality of scan line image processing units in accordance with a predetermined interleave factor; and
   balancing load of processing the edge list among the plurality of scan line image processing units in accordance with a FIFO size of each scan line image processing unit.

5. The method of claim 1, wherein processing the plurality of convex polygons comprises:
   configuring each scan line image processing unit to process a portion of a convex polygon in a round-robin fashion.

6. The method of claim 5, further comprising:
   scanning the portion of the convex polygon according to a predetermined scan direction;
   rasterizing the portion of the convex polygon; and
   performing fade operations at boundaries of the portion of the convex polygon.

7. The method of claim 6, wherein scanning the portion of the convex polygon comprises at least one of:
   scanning the portion of the convex polygon along a column; and
   scanning the portion of the convex polygon along a row.

8. The method of claim 6, wherein performing fade operations comprises:
   using a second sentinel to control fade operations at boundaries of the portion of the convex polygon; and
   outputting data from the fade operations at each of the scan line image processing units in accordance with the second sentinel.

9. The method of claim 3, wherein synchronizing operations of the plurality of scan line image processing units comprises:
   linking the FIFO in each scan line image processing unit to form a chain of FIFOs for storing the plurality of convex polygons described in the edge list.

10. A parallel image processing system for mask-less lithography, comprising:
a graphics engine configured to process one or more graphical objects to generate a plurality of convex polygons, and to form an edge list for representing each of the plurality of convex polygons, wherein the processing one or more graphic objects utilizes a pixel grid shifted horizontally and vertically by a non-integer amount;
a distributor configured to distribute the edge list to a plurality of scan line image processing units;
a plurality of scan line image processing units configured to receive the edge list and to process the plurality of convex polygons in parallel;
control logic configured to synchronize operations of the plurality of scan line image processing units using a sentinel, wherein the sentinel includes a unique pattern configured to signal end of a scan line;
a plurality of buffers configured to store image data generated from the scan line image processing units;
control logic configured to control output of image data from the plurality of buffers using the sentinel;
a plurality of digital micro-mirror devices which receives the image data from the plurality of buffers; and
control logic configured to apply a mask data pattern directly to a substrate using the plurality of digital micro-mirror devices by selectively exposing the substrate to radiation in a mask-less lithography process.

11. The system of claim 10, wherein the graphic engine comprises:
control logic configured to identify transitions at the boundaries of the one or more graphical objects according to a scan direction; and
control logic configured to partition the one or more graphical objects into the plurality of convex polygons.

12. The system of claim 10, wherein
each scan line image processing unit includes: a FIFO configured to store items of the edge list, an incremental interpolation update logic configured to update items of the edge list, a multiplexor configured to receive data from a distributor and a previous scan line image processing unit.

13. The system of claim 10, wherein the distributor comprises:
control logic configured to balance load of processing the edge list among the plurality of scan line image processing units in accordance with a predetermined interleave factor; and
control logic configured to balance load of processing the edge list among the plurality of scan line image processing units in accordance with a FIFO size of each scan line image processing unit.

14. The system of claim 10, wherein the plurality of scan line image processing units comprise:
control logic configured to process a portion of a convex polygon in a round-robin fashion.

15. The system of claim 14, wherein each scan line image processing unit further comprises:
control logic configured to scan the portion of the convex polygon according to a predetermined scan direction;
control logic configured to rasterize the portion of the convex polygon; and
control logic configured to perform fade operations at boundaries of the portion of the convex polygon.

16. The system of claim 15, wherein the control logic configured to scan the portion of the convex polygon comprises at least one of:
control logic configured to scan the portion of the convex polygon along a column; and
control logic configured to scan the portion of the convex polygon along a row.

17. The system of claim 15, wherein the control logic configured to perform fade operations comprises:
control logic configured to use a second sentinel to control fade operations at boundaries of the portion of the convex polygon; and
control logic configured to output data from the fade operations at each of the scan line image processing unit in accordance with the second sentinel.

18. The system of claim 12, wherein the control logic configured to synchronize operations of the plurality of scan line image processing units comprises:
control logic configured to link the FIFO in each scan line image processing unit to form a chain of FIFOs for storing the plurality of convex polygons described in the edge list.

* * * * *